United States Patent
Brask et al.

(10) Patent No.: US 7,153,734 B2
(45) Date of Patent: *Dec. 26, 2006

(54) CMOS DEVICE WITH METAL AND SILICIDE GATE ELECTRODES AND A METHOD FOR MAKING IT

(75) Inventors: Justin K. Brask, Portland, OR (US); Mark L. Doczy, Beaverton, OR (US); Jack Kavalieros, Portland, OR (US); Matthew V. Metz, Hillsboro, OR (US); Chris E. Barns, Portland, OR (US); Uday Shah, Portland, OR (US); Suman Datta, Beaverton, OR (US); Christopher D. Thomas, Aloha, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/748,559

(22) Filed: Dec. 29, 2003

(65) Prior Publication Data

US 2005/0148136 A1 Jul. 7, 2005

(51) Int. Cl.
*H01L 21/8238* (2006.01)
(52) U.S. Cl. .................... 438/199; 438/592; 438/216; 438/585

(58) Field of Classification Search ........ 438/591–592, 438/587–588, 585, 199, 227–228, 216; 257/310, 257/410–413
See application file for complete search history.

(56) References Cited

U.S. PATENT DOCUMENTS

| | | | |
|---|---|---|---|
| 6,063,698 A | 5/2000 | Tseng et al. | 438/585 |
| 6,184,072 B1 | 2/2001 | Kaushik et al. | 438/197 |
| 6,204,103 B1 * | 3/2001 | Bai et al. | 438/224 |
| 6,255,698 B1 | 7/2001 | Gardner et al. | 257/369 |
| 6,303,418 B1 * | 10/2001 | Cha et al. | 438/592 |
| 6,365,450 B1 * | 4/2002 | Kim | 438/216 |

(Continued)

FOREIGN PATENT DOCUMENTS

EP 0 899 784 AZ 3/1999

(Continued)

OTHER PUBLICATIONS

Polishchuk et al., "Dual Workfunction CMOS Gate Technology Based on Metal Interdiffusion," www.eesc.berkeley.edu, 1 page.

(Continued)

*Primary Examiner*—Thao X. Le
(74) *Attorney, Agent, or Firm*—Michael D. Plomier

(57) ABSTRACT

A semiconductor device and a method for forming it are described. The semiconductor device comprises a metal NMOS gate electrode that is formed on a first part of a substrate, and a silicide PMOS gate electrode that is formed on a second part of the substrate.

4 Claims, 2 Drawing Sheets

U.S. PATENT DOCUMENTS

| | | | |
|---|---|---|---|
| 6,410,376 B1 | 6/2002 | Ng et al. | 438/199 |
| 6,420,279 B1 | 7/2002 | Ono et al. | 438/785 |
| 6,475,874 B1 | 11/2002 | Xiang et al. | 438/396 |
| 6,475,908 B1* | 11/2002 | Lin et al. | 438/659 |
| 6,514,828 B1 | 2/2003 | Ahn et al. | 438/240 |
| 6,518,154 B1* | 2/2003 | Buynoski et al. | 438/585 |
| 6,544,906 B1 | 4/2003 | Rotondaro et al. | 438/785 |
| 6,586,288 B1 | 7/2003 | Kim et al. | 438/183 |
| 6,617,209 B1 | 9/2003 | Chau et al. | 438/240 |
| 6,617,210 B1 | 9/2003 | Chau et al. | 438/240 |
| 6,642,094 B1* | 11/2003 | Rotondaro et al. | 438/199 |
| 6,642,131 B1 | 11/2003 | Harada | 438/591 |
| 6,645,818 B1 | 11/2003 | Sing et al. | 438/275 |
| 6,667,246 B1 | 12/2003 | Mitsuhashi et al. | 438/756 |
| 6,770,568 B1* | 8/2004 | Brask | 438/746 |
| 6,794,306 B1* | 9/2004 | Kim et al. | 438/752 |
| 6,835,639 B1* | 12/2004 | Rotondaro et al. | 438/592 |
| 6,841,441 B1* | 1/2005 | Ang et al. | 438/232 |
| 6,846,734 B1* | 1/2005 | Amos et al. | 438/592 |
| 6,858,483 B1* | 2/2005 | Doczy et al. | 438/199 |
| 2002/0058374 A1 | 5/2002 | Kim et al. | 438/228 |
| 2002/0197790 A1 | 12/2002 | Kizilyalli et al. | 438/240 |
| 2003/0032303 A1 | 2/2003 | Yu et al. | 438/770 |
| 2003/0045080 A1 | 3/2003 | Visokay et al. | 438/591 |
| 2004/0018681 A1 | 1/2004 | Pham et al. | 438/257 |
| 2004/0099916 A1* | 5/2004 | Rotondaro et al. | 257/412 |
| 2005/0139928 A1* | 6/2005 | Kavalieros et al. | 438/199 |

FOREIGN PATENT DOCUMENTS

| | | |
|---|---|---|
| EP | 1 383 161 A1 | 1/2004 |
| GB | 2 347 789 A | 9/2000 |
| GB | 2 358 737 A | 4/2001 |

OTHER PUBLICATIONS

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages.

Doczy et al., "Integrating N-type and P-type Metal Gate Transistors", U.S. Appl. No. 10/327,293, filed Dec. 20, 2002.

Brask et al., "A Method of Making Semiconductor Device Having a High-K Gate Dielectric", U.S. Appl. No. 10/387,303, filed Mar. 11, 2003.

Brask et al., "A Method of Making Semiconductor Device Having a High-K Gate Dielectric", U.S. Appl. No. 10/391,816, filed Mar. 18, 2003.

Chau et al., "A Method for Making a Semiconductor Device Having a Metal Gate Electrode", U.S. Appl. No. 10/431,166, filed May 6, 2003.

Brask et al., "A Selective Etch Process for Making a Semiconductor Device Having a High-K Gate Dielectric", U.S. Appl. No. 10/652,546, filed Aug. 28, 2003.

Brask et al., "A Method for Making a Semiconductor Device Having a High-K Gate Dielectric," U.S. Appl. No. 10/642,796, filed Aug. 28, 2003.

Brask et al., "Methods and Compositions for Selectively Etching Metal Films and Structures," U.S. Appl. No. 10/658,225, filed Sep. 8, 2003.

Brask et al., "A Method for Making a Semiconductor Device that Includes a Metal Gate Electrode", U.S. Appl. No. Unknown, filed Dec. 18, 2003.

Brask et al. "A Method for Making a Semiconductor Device with a Metal Gate Electrode that is Formed on an Annealed High-K Gate Dielectric Layer", U.S. Appl. No. Unknown, filed Dec. 19, 2003.

PCT Notification of Transmittal of the International Search Report and the Written Opinion of the . . . , dated May 5, 2005, International Application No. PCT/US2004/043656.

* cited by examiner

CMOS DEVICE WITH METAL AND SILICIDE GATE ELECTRODES AND A METHOD FOR MAKING IT

FIELD OF THE INVENTION

The present invention relates to semiconductor devices, in particular, CMOS devices with metal and silicide gate electrodes.

BACKGROUND OF THE INVENTION

CMOS devices with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it has been suggested that metal gate electrodes replace polysilicon based gate electrodes in devices that include high-k gate dielectrics.

Although metal gate electrodes may be used to form both NMOS and PMOS transistors, it may not be possible to generate gate electrodes with optimal workfunctions, if the same material is used to make metal gate electrodes for both types of transistors. It may be possible to address this problem by forming the NMOS transistor's metal gate electrode from a first material and the PMOS transistor's metal gate electrode from a second material. The first material may ensure an acceptable workfunction for the NMOS gate electrode, while the second material may ensure an acceptable workfunction for the PMOS gate electrode. Processes for forming such dual metal gate devices may, however, be complex and expensive.

A PMOS transistor with a silicide gate electrode may manifest acceptable drive current and mobility properties, even when its gate dielectric is made from a very thin layer of silicon dioxide. NMOS transistors with silicide gate electrodes and very thin silicon dioxide gate dielectrics may not, however, have similar characteristics.

Accordingly, there is a need for a semiconductor device that includes both NMOS and PMOS transistors, in which the PMOS transistor comprises a silicide PMOS electrode that is formed on a very thin gate dielectric layer. There is a need for a relatively inexpensive and uncomplicated process for making such a CMOS device that shows acceptable transistor performance for both types of transistors. The present invention provides such a semiconductor device and a method for making it.

Features shown in these figures are not intended to be drawn to scale.

DETAILED DESCRIPTION OF THE PRESENT INVENTION

A semiconductor device and a method for making it are described. That semiconductor device comprises a metal NMOS gate electrode that is formed on a first part of a substrate, and a silicide PMOS gate electrode that is formed on a second part of the substrate. An embodiment of a method for making that semiconductor device comprises forming a first polysilicon layer, which is bracketed by a pair of sidewall spacers, on a first gate dielectric layer, and a p-type polysilicon layer on a second gate dielectric layer. After removing the first polysilicon layer to generate a trench that is positioned between the pair of sidewall spacers, an n-type metal layer is formed within the trench, and substantially all of the p-type polysilicon layer is converted to a silicide.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
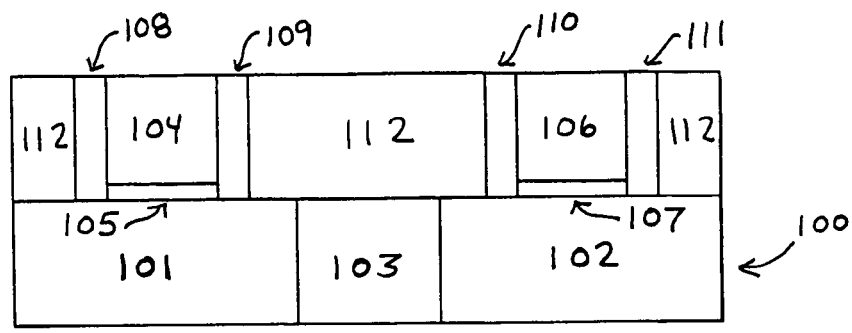
FIGS. 1a–1g represent cross-sections of structures that may be formed when carrying out an embodiment of a method for making the semiconductor device of the present invention.

FIGS. 1a–1g illustrate structures that may be formed, when carrying out an embodiment of a method for making the semiconductor device of the present invention. FIG. 1a represents an intermediate structure that may be formed when making a complementary metal oxide semiconductor ("CMOS"). That structure includes first part 101 and second part 102 of substrate 100. Isolation region 103 separates first part 101 from second part 102. First polysilicon layer 104 is formed on first gate dielectric layer 105, and p-type polysilicon layer 106 is formed on second gate dielectric layer 107. First polysilicon layer 104 is bracketed by a pair of sidewall spacers 108, 109, and p-type polysilicon layer 106 is bracketed by a pair of sidewall spacers 110, 111. Dielectric 112 lies next to the sidewall spacers.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Isolation region 103 may comprise silicon dioxide, or other materials that may separate the transistor's active regions. First gate dielectric layer 105 and second gate dielectric layer 107 may each comprise silicon dioxide, or other materials that may insulate the substrate from the gate electrodes. Dielectric layers 105, 107 preferably comprise a high quality, dense thermally grown silicon dioxide layer that is less than about 20 angstroms thick, and more preferably that is between about 5 and about 10 angstroms thick. First polysilicon layer 104 and p-type polysilicon layer 106 preferably are each between about 100 and about 2,000 angstroms thick, and more preferably between about 500 and about 1,600 angstroms thick.

First polysilicon layer 104 may be undoped or doped with arsenic, phosphorus or another n-type material, while p-type polysilicon layer 106 preferably is doped with boron. When doped with boron, p-type polysilicon layer 106 should include that element at a sufficient concentration to ensure that a subsequent wet etch process, for removing first polysilicon layer 104, will not remove a significant amount of p-type polysilicon layer 106. Spacers 108, 109, 110, 111 preferably comprise silicon nitride, while dielectric 112 may comprise silicon dioxide, or a low-K material. Dielectric 112 may be doped with phosphorus, boron, or other elements, and may be formed using a high density plasma deposition process.

Conventional process steps, materials, and equipment may be used to generate the FIG. 1a structure, as will be apparent to those skilled in the art. As shown, dielectric 112 may be polished back, e.g., via a conventional chemical mechanical polishing ("CMP") operation, to expose first polysilicon layer 104 and p-type polysilicon layer 106. Although not shown, the FIG. 1a structure may include many other features (e.g., a silicon nitride etch stop layer, source and drain regions, and one or more buffer layers) that may be formed using conventional processes.

When source and drain regions are formed using conventional ion implantation and anneal processes, it may be desirable to form a hard mask on polysilicon layers 104, 106—and an etch stop layer on the hard mask—to protect layers 104, 106 when the source and drain regions are covered with a silicide. The hard mask may comprise silicon nitride, and the etch stop layer may comprise a material that will be removed at a substantially slower rate than silicon nitride will be removed when an appropriate etch process is applied. Such an etch stop layer may, for example, be made from silicon, an oxide (e.g., silicon dioxide or hafnium dioxide), or a carbide (e.g., silicon carbide).

Such a hard mask and etch stop combination may be formed on layers 104, 106 in the following way. Before the polysilicon layer is patterned, a layer of silicon nitride may be deposited on it, followed by depositing the etch stop layer on the silicon nitride layer. The silicon nitride layer preferably is between about 100 and about 500 angstroms thick, and more preferably is between about 200 and about 250 angstroms thick. The etch stop layer preferably is between about 200 and about 1,200 angstroms thick, and more preferably is between about 400 and about 600 angstroms thick. After those layers are deposited on the polysilicon layer, conventional lithography and etch processes may be applied to pattern the etch stop layer and the silicon nitride layer, which will serve as a hard mask, as those processes pattern layers 104, 106.

The etch stop layer and the silicon nitride hard mask may be polished from the surface of layers 104, 106, when dielectric layer 112 is polished—as those layers will have served their purpose by that stage in the process. FIG. 1a represents a structure in which any hard mask or etch stop layer, which may have been previously formed on layers 104, 106, has already been removed from the surface of those layers. If epitaxial growth techniques are used to form the source and drain regions, which are not accompanied by silicide formation, then it may not be advantageous to form such a hard mask and etch stop layer on the polysilicon layer prior to patterning that layer. When ion implantation processes are used to form the source and drain regions, layers 104, 106 may be doped at the same time the source and drain regions are implanted. In such a process, first polysilicon layer 104 may be characterized as an n-type polysilicon layer.

Figure 1B:
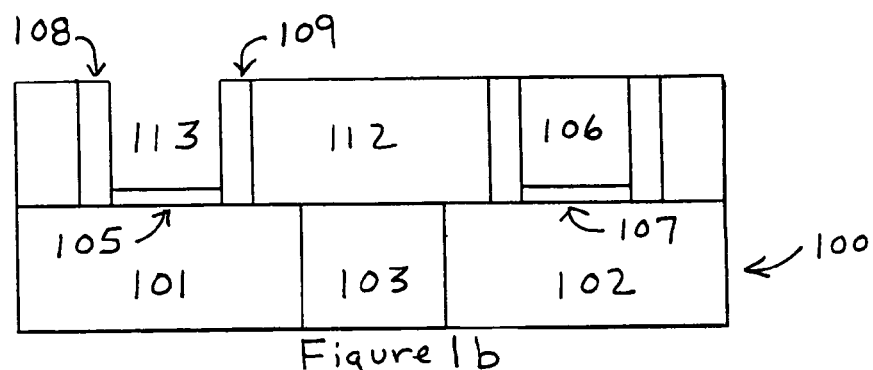
Figure 1C:
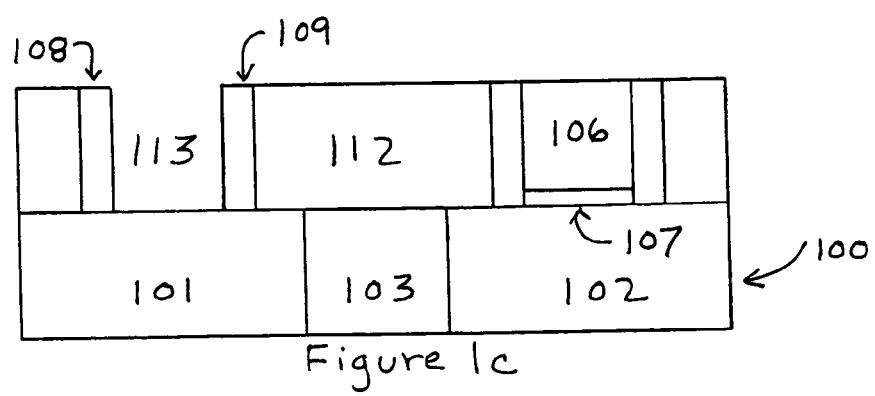

After forming the FIG. 1a structure, first polysilicon layer 104 may be removed to generate trench 113 that is positioned between sidewall spacers 108, 109, producing the structure shown in FIG. 1b. After removing first polysilicon layer 104, first gate dielectric layer 105 is exposed. In a preferred embodiment, first polysilicon layer 104 is removed by applying a wet etch process that is selective for first polysilicon layer 104 over p-type polysilicon layer 106 to remove first polysilicon layer 104 without removing significant portions of p-type polysilicon layer 106.

Such a wet etch process may comprise exposing first polysilicon layer 104 to an aqueous solution that comprises a source of hydroxide for a sufficient time at a sufficient temperature to remove substantially all of layer 104. That source of hydroxide may comprise between about 2 and about 30 percent ammonium hydroxide or a tetraalkyl ammonium hydroxide, e.g., tetramethyl ammonium hydroxide ("TMAH"), by volume in deionized water. First polysilicon layer 104 may be selectively removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which preferably lasts at least one minute, it may be desirable to apply sonic energy at a frequency of between about 10 KHz and about 2,000 KHz, while dissipating at between about 1 and about 10 watts/cm$^2$.

In a particularly preferred embodiment, first polysilicon layer 104, with a thickness of about 1,350 angstroms, may be selectively removed by exposing it at about 25° C. for about 30 minutes to a solution that comprises about 15 percent ammonium hydroxide by volume in deionized water, while applying sonic energy at about 1,000 KHz—dissipating at about 5 watts/cm$^2$. Such an etch process should remove substantially all of n-type polysilicon layer 104 without removing a meaningful amount of p-type polysilicon layer 106.

As an alternative, first polysilicon layer 104 may be selectively removed by exposing it for at least one minute to a solution, which is maintained at a temperature between about 60° C. and about 90° C., that comprises between about 20 and about 30 percent TMAH by volume in deionized water, while applying sonic energy. Removing first polysilicon layer 104, with a thickness of about 1,350 angstroms, by exposing it at about 80° C. for about 2 minutes to a solution that comprises about 25 percent TMAH by volume in deionized water, while applying sonic energy at about 1,000 KHz—dissipating at about 5 watts/cm$^2$—may remove substantially all of first polysilicon layer 104 without removing a significant amount of p-type polysilicon layer 106.

After removing first polysilicon layer 104, first gate dielectric layer 105, which may comprise silicon dioxide, may be retained—followed by forming an n-type metal layer on layer 105. Alternatively, first gate dielectric layer 105 may be removed, producing the FIG. 1c structure. When first gate dielectric layer 105 comprises silicon dioxide, it may be removed using an etch process that is selective for silicon dioxide. Such etch processes include: exposing layer 105 to a solution that includes about 1 percent HF in deionized water, or applying a dry etch process that employs a fluorocarbon based plasma. The time layer 105 is exposed should be limited, as the etch process for removing layer 105 may also remove part of dielectric layer 112. With that in mind, if a 1 percent HF based solution is used to remove layer 105, the device preferably should be exposed to that solution for less than about 60 seconds, and more preferably for about 30 seconds or less.

When first gate dielectric layer 105 is removed, it must be replaced prior to forming an n-type metal layer within trench 113. Preferably, high-k gate dielectric layer 114 is formed on substrate 100 at the bottom of trench 113, after first gate dielectric layer 105 has been removed—generating the structure illustrated by FIG. 1d. Some of the materials that may be used to make high-k gate dielectric 114 include: hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form high-k gate dielectric layer 114 are described here, that layer may be made from other materials.

High-k gate dielectric layer 114 may be formed on substrate 100 using a conventional deposition method, e.g., a conventional chemical vapor deposition ("CVD"), low pressure CVD, or physical vapor deposition ("PVD") process. Preferably, a conventional atomic layer, CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 114. The CVD reactor should be operated long enough to form a layer with the desired thickness. In most applications, high-k gate dielectric layer 114 should be less than about 60 angstroms thick, and more preferably between about 5 angstroms and about 40 angstroms thick.

Figure 1D:
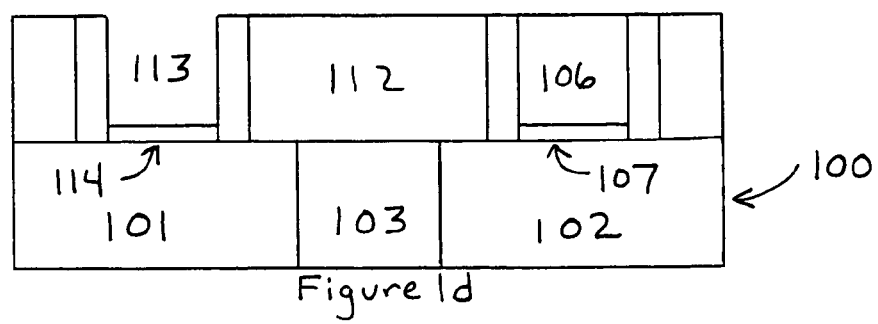

Although not shown in FIG. 1d, if an atomic layer CVD process is used to form high-k gate dielectric layer 114, that layer may form on the sides of trench 113 in addition to forming on the bottom of that trench. If high-k gate dielectric layer 114 comprises an oxide, it may manifest oxygen vacancies at random surface sites and unacceptable impurity levels, depending upon the process used to make it. It may be desirable to remove certain impurities from layer 114, and to oxidize it to generate a layer with a nearly idealized metal: oxygen stoichiometry, after layer 114 is deposited.

Figure 1E:
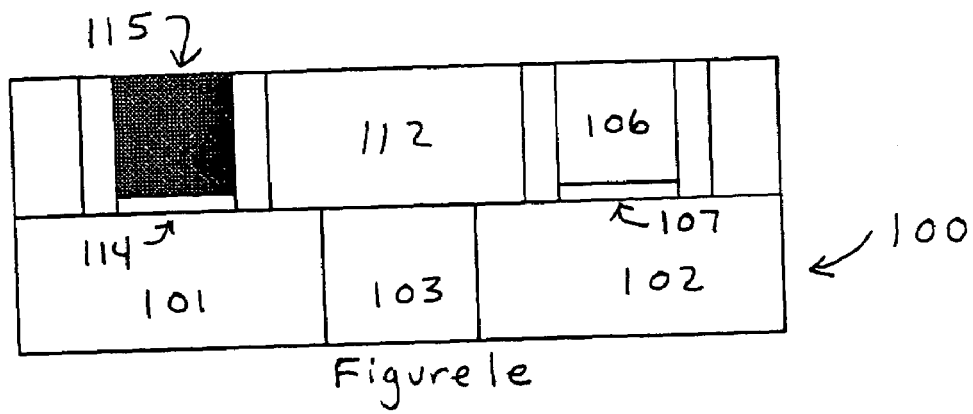

After high-k gate dielectric layer 114 is formed on substrate 100, in this embodiment n-type metal layer 115 is formed within trench 113 and on high-k gate dielectric layer 114, creating the FIG. 1e structure. N-type metal layer 115 may comprise any n-type conductive material from which a metal NMOS gate electrode may be derived. N-type metal layer 115 preferably has thermal stability characteristics that render it suitable for making a metal NMOS gate electrode for a semiconductor device.

Materials that may be used to form n-type metal layer 115 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide. N-type metal layer 115 may be formed on high-k dielectric layer 114 using well known PVD or CVD processes, e.g., conventional sputter or atomic layer CVD processes. As shown, n-type metal layer 115 is removed except where it fills trench 113. Layer 115 may be removed from other portions of the device via a wet or dry etch process, or an appropriate CMP operation. Dielectric 112 may serve as an etch or polish stop, when layer 115 is removed from its surface.

N-type metal layer 115 preferably serves as a metal NMOS gate electrode that has a workfunction that is between about 3.9 eV and about 4.2 eV, and that is between about 100 angstroms and about 2,000 angstroms thick, and more preferably is between about 500 angstroms and about 1,600 angstroms thick. Although FIG. 1e represents a structure in which n-type metal layer 115 fills all of trench 113, in alternative embodiments, n-type metal layer 115 may fill only part of trench 113, with the remainder of the trench being filled with a material that may be easily polished, e.g., tungsten or aluminum. In such an alternative embodiment, n-type metal layer 115, which serves as the workfunction metal, may be between about 50 and about 1,000 angstroms thick—and more preferably at least about 100 angstroms thick. In embodiments in which trench 113 includes both a workfunction metal and a trench fill metal, the resulting metal NMOS gate electrode may be considered to comprise the combination of both the workfunction metal and the trench fill metal.

Figure 1F:
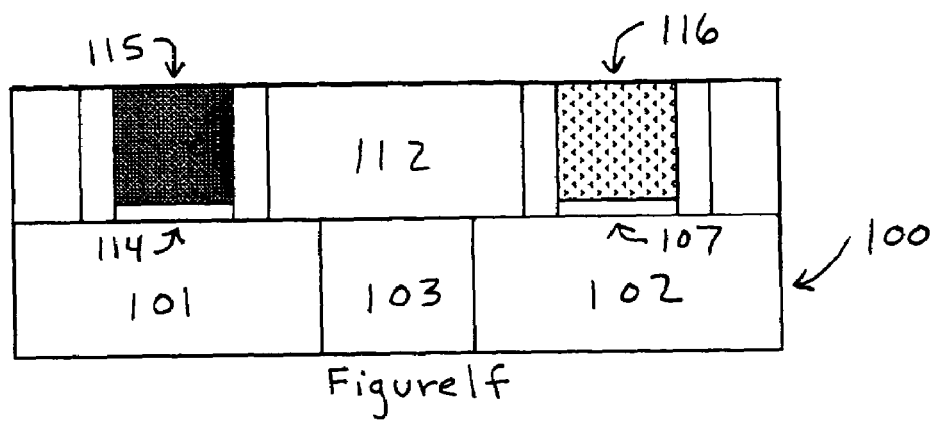

In the illustrated embodiment, after forming n-type metal layer 115 within trench 113, substantially all of p-type polysilicon layer 106 (and preferably all of that layer) is converted to silicide 116, as shown in FIG. 1f. Silicide 116 may comprise nickel silicide, cobalt silicide, titanium silicide, a combination of those materials, or any other type of silicide that may yield a high performance silicide PMOS gate electrode. P-type polysilicon layer 106 may be converted to silicide 116 by depositing an appropriate metal over the entire structure, then applying heat at a sufficient temperature for a sufficient time to generate a metal silicide (e.g., NiSi) from p-type polysilicon layer 106.

In a preferred embodiment, silicide 116 is formed by first sputtering an appropriate metal (e.g., nickel) over the entire structure, including the exposed surface of layer 106. To cause silicide 116 to extend completely through p-type polysilicon layer 106, it may be necessary to follow that sputter operation with a high temperature anneal, e.g., a rapid thermal anneal that takes place at a temperature of at least about 450° C. When forming nickel silicide, the anneal preferably takes place at a temperature that is between about 500° C. and about 550° C. When forming cobalt silicide, the anneal preferably takes place at a temperature that is at least about 600° C.

A conventional wet etch or dry etch process, or a conventional CMP step, may be applied to remove excess metal from the structure, after creating silicide 116—dielectric 112 serving as an etch or polish stop. Silicide 116 may serve as a silicide PMOS gate electrode with a midgap workfunction that is between about 4.3 eV and about 4.8 eV, and that is between about 100 angstroms and about 2,000 angstroms thick, and more preferably is between about 500 angstroms and about 1,600 angstroms thick.

Although a few examples of materials that may be used to form n-type metal layer 115 and silicide 116 are described here, that metal layer and that silicide may be made from many other materials, as will be apparent to those skilled in the art. After forming silicide 116, a capping dielectric layer 117 may be deposited onto dielectric layer 112, metal NMOS gate electrode 118, and silicide PMOS gate electrode 119, generating the FIG. 1g structure. Capping dielectric layer 117 may be deposited using any conventional deposition process. Process steps for completing the device that follow the deposition of capping dielectric layer 117, e.g., forming the device's contacts, metal interconnect, and passivation layer, are well known to those skilled in the art and will not be described here.

Although the illustrated embodiment replaces first gate dielectric layer 105 with high-k gate dielectric layer 114, in alternative embodiments, first gate dielectric layer 105, which may comprise silicon dioxide, may be retained, and n-type metal layer 115 may be formed directly upon layer 105. The method described above enables production of CMOS devices that include a metal NMOS gate electrode and a silicide PMOS gate electrode—without having to perform relatively complex and costly process steps. Although the embodiments described above provide examples of processes for forming such devices, the present invention is not limited to these particular embodiments.

Figure 1G:
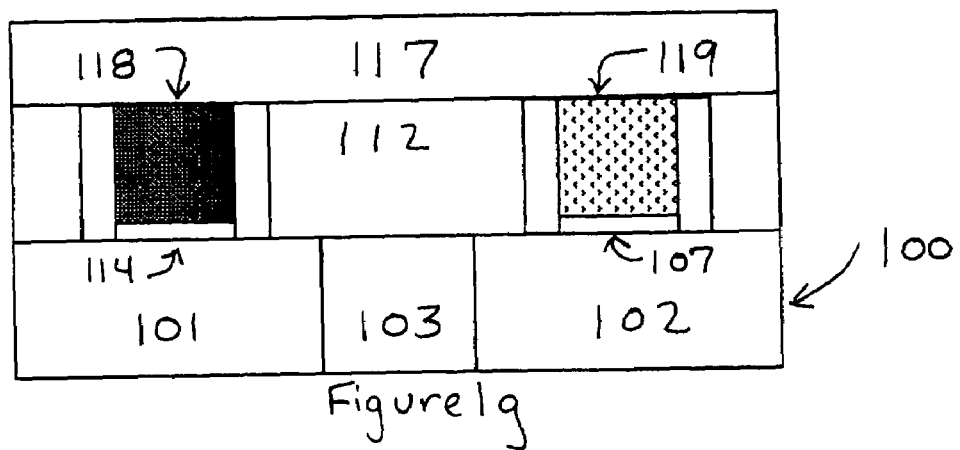

The semiconductor device of FIG. 1g comprises metal NMOS gate electrode 118 that is formed on first part 101 of substrate 100, and silicide PMOS gate electrode 119 that is formed on second part 102 of substrate 100. As indicated above, metal NMOS gate electrode 118 may consist entirely of one or more of the n-type metals identified above, or, alternatively, may comprise an n-type workfunction metal that is capped by a trench fill metal. As described above, first part 101 of substrate 100 may comprise high-k gate dielectric layer 114, while second part 102 of substrate 100 comprises second gate dielectric layer 107. Metal NMOS gate electrode 118 preferably is between about 100 and about 2,000 angstroms thick, has a workfunction that is between about 3.9 eV and about 4.2 eV, and comprises one or more of the n-type materials identified above. Silicide PMOS gate electrode 119 preferably is between about 100 and about 2,000 angstroms thick, has a midgap workfunction that is between about 4.3 eV and about 4.8 eV, and comprises one of the silicides identified above.

High-k gate dielectric layer 114 may comprise one or more of the materials listed above, while second gate dielectric layer 107 may comprise silicon dioxide. Alternatively, when first gate dielectric layer 105 is not replaced with high-k gate dielectric layer 114 after first polysilicon layer 104 is removed, first part 101 of substrate 100 may instead comprise first gate dielectric layer 105—with both first gate dielectric layer 105 and second gate dielectric layer 107 each comprising silicon dioxide.

Although the semiconductor device of the present invention may be made using the processes set forth in detail above, it may alternatively be formed using other types of processes. For that reason, that semiconductor device is not intended to be limited to devices that may be made using the processes described above. Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:

forming an n-type polysilicon layer, which is bracketed by a pair of sidewall spacers, on a first gate dielectric layer, and a p-type polysilicon layer on a second gate dielectric layer;

applying a wet etch process tat is selective for the n-type polysilicon layer over the p-type polysiicon layer to remove the n-type polysilicon layer without removing significant portions of the p-type polysilicon layer, generating a trench that is positioned between the pair of sidewall spacers, and exposing the first gate diclectjic layer;

removing the exposed first gate dielectric layer;

forming a high-k gate dielectric layer on the substrate at the bottom of the trench;

forming an n-type metal layer on the high-k gate dielectric layer to generate a metal NMOS gate electrode; and converting the p-type polysilicon layer to a silicide to generate a silicide PMOS gate electrode.

2. The method of claim 1 wherein:

the high-k gate dielectric layer is fonned by atomic layer chemical vapor deposition, and comprises a material selected from the group consisting of hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate;

the n-type metal layer compxises a material that is selected from the group consisting of hafnium, zirconium, titanium, tantalum, aluminum, and a metal carbide; and the suicide comprises a material selected from the group consisting of nickel silicide, cobalt suicide, and titanium silicide.

3. The method of claim 1 wherein the wet etch process comprises exposing the n-type polysilicon layer to an aqueous solution that includes between about 2 and about 30 percent of a source of hydroxide by volume.

4. The method of claim 3 wherein the source of hydroxide comprises a compound that is selected from the group consisting of animonium hydroxide and tetramethyl ammonium hydroxide.

* * * * *